(12) United States Patent
Yajima et al.

(10) Patent No.: US 7,923,355 B2
(45) Date of Patent: Apr. 12, 2011

(54) MANUFACTURING METHOD FOR SEMICONDUCTOR DEVICE AND MANUFACTURING APPARATUS FOR SEMICONDUCTOR DEVICE

(75) Inventors: Masayoshi Yajima, Kanagawa-ken (JP); Yoshikazu Moriyama, Izu (JP)

(73) Assignee: Nuflare Technology, Inc., Shizuoka-ken (JP)

( * ) Notice: Subject to any disclaimer, the term of this patent is extended or adjusted under 35 U.S.C. 154(b) by 185 days.

(21) Appl. No.: 12/257,845

(22) Filed: Oct. 24, 2008

(65) Prior Publication Data
US 2009/0111278 A1    Apr. 30, 2009

(30) Foreign Application Priority Data
Oct. 25, 2007    (JP) .................. 2007-277836

(51) Int. Cl.
*H01L 21/20*    (2006.01)
*H01L 21/36*    (2006.01)
*H01L 21/31*    (2006.01)

(52) U.S. Cl. ........ 438/481; 438/478; 438/479; 438/758; 257/E21.01

(58) Field of Classification Search .................. None
See application file for complete search history.

(56) References Cited

U.S. PATENT DOCUMENTS

| | | | |
|---|---|---|---|
| 2003/0129811 A1* | 7/2003 | Raaijmakers et al. | 438/481 |
| 2004/0224089 A1* | 11/2004 | Singh et al. | 427/255.27 |
| 2006/0286776 A1* | 12/2006 | Ranish et al. | 438/478 |
| 2007/0066082 A1* | 3/2007 | Schauer et al. | 438/758 |
| 2007/0232031 A1* | 10/2007 | Singh et al. | 438/479 |

FOREIGN PATENT DOCUMENTS

JP    11-67675    3/1999

* cited by examiner

*Primary Examiner* — Andy Huynh
*Assistant Examiner* — Valerie Brown
(74) *Attorney, Agent, or Firm* — Finnegan, Henderson, Farabow, Garrett & Dunner, L.L.P.

(57) ABSTRACT

A manufacturing method for a semiconductor device includes retaining a wafer in a reaction chamber, supplying first process gas including source gas and second process gas containing $H_2$ or inert gas onto the wafer in a rectified state alternately in a predetermined cycle, rotating the wafer, and heating the wafer to form a film on the wafer.

20 Claims, 2 Drawing Sheets

MANUFACTURING METHOD FOR SEMICONDUCTOR DEVICE AND MANUFACTURING APPARATUS FOR SEMICONDUCTOR DEVICE

CROSS-REFERENCE TO RELATED APPLICATIONS

This application is based upon and claims the benefit of priority from the prior Japanese Patent Application No. 2007-277836 filed on Oct. 25, 2007, the entire contents of which are incorporated herein by reference.

BACKGROUND OF THE INVENTION

1. Field of the Invention

The present invention relates to a manufacturing method for a semiconductor device and a manufacturing apparatus for a semiconductor device. A film is formed, for example, by supplying process gas onto a wafer while heating the wafer.

2. Description of the Related Art

In recent years, with requirements of low cost and high performance of a semiconductor device, high productivity in a film formation process as well as high quality such as high film thickness uniformity is required.

In an epitaxial film forming apparatus, as a wafer diameter increases, for example, to 200 mm or 300 mm, a single-wafer-processing type has superseded a batch type that processes a plurality of wafers to satisfy the above requirements. Moreover, epitaxial growth conditions have been changed for maintenanceability and requirement of low cost and the like. For example, low-pressure growth using mono-silane has been replaced with atmospheric-pressure growth using an inexpensive Cl based source gas with few deposits such as trichlorosilane (hereinafter referred to as TCS) or dichlorosilane.

However, some semiconductor elements such as IGBT (insulated gate bipolar transistor) require a thick epitaxial film. In performing such thick-film formation, the single-wafer-processing type causes low productivity. Although the batch type has been used to increase productivity in some case, controlling film thickness uniformity is difficult as found in the single-wafer-processing type.

In addition, if the epitaxial film thickness exceeds 100 μm (e.g. 150 μm), an apparatus that has a low film formation rate drastically lowers productivity regardless of single-wafer-processing type or batch type. Accordingly, to improve productivity while maintaining high quality, there has been used a high-speed rotation type manufacturing apparatus that performs epitaxial growth by heating while performing high-speed rotation, for example, at 900 rpm or more, as disclosed in Japanese Patent Application Laid-Open No. 11-67675.

On the other hand, there occurs a problem that polysilicon generated at film formation deposits on wafer retention members. This is common to any epitaxial film forming apparatus. The deposition of polysilicon has an adverse effect upon the members and further serious effects upon wafer quality by particle, adhesion and the like. Accordingly, deposited polysilicon is required to be removed by etching.

However, frequent etching drastically lowers productivity, and repetition of temperature rise and fall accelerates deterioration of the members. Hence, even with the high-speed rotation type film forming apparatus, productivity is lowered and consumables costs are increased.

SUMMARY OF THE INVENTION

It is an object of the present invention to provide a manufacturing method for a semiconductor device and a manufacturing apparatus for a semiconductor device, capable of increasing a atmospheric-pressure epitaxial growth rate using Cl based source gas and preventing low productivity due to cleaning.

According to an aspect of the present invention, there is provided a manufacturing method for a semiconductor device, including retaining a wafer in a reaction chamber, supplying first process gas including source gas and second process gas containing $H_2$ or inert gas onto the wafer in a rectified state alternately in a predetermined period, rotating the wafer, and heating the wafer to form a film on the wafer.

According to an aspect of the present invention there is provided a manufacturing apparatus for a semiconductor device for forming a film on a wafer, including a reaction chamber in which the wafer is introduced, a first gas supply mechanism for supplying a first process gas including source gas and a second process gas containing hydrogen gas or inert gas in the reaction chamber, a first gas control mechanism for controlling so that the first process gas and the second process gas are alternately supplied, a first rectifying plate for supplying the first process gas or the second process gas supplied from the first gas supply mechanism onto the wafer in a rectified state, a gas discharge mechanism for discharging the gas from the reaction chamber, a retention mechanism for retaining the wafer at a predetermined position in the reaction chamber, and a heater for heating the wafer.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the forgoing general description and the following detailed description are exemplary and explanatory only and are not restrictive of the invention, as claimed.

BRIEF DESCRIPTION OF THE DRAWINGS

The accompanying drawings, which is incorporated in and constitute a part of this specification, illustrates an embodiment of the invention and together with the description, serve to explain the principles of the invention.

DETAILED DESCRIPTION

Reference will now be made in detail to the present embodiment of the invention, an example of which is illustrated in the accompanying drawings.

Figure 1:
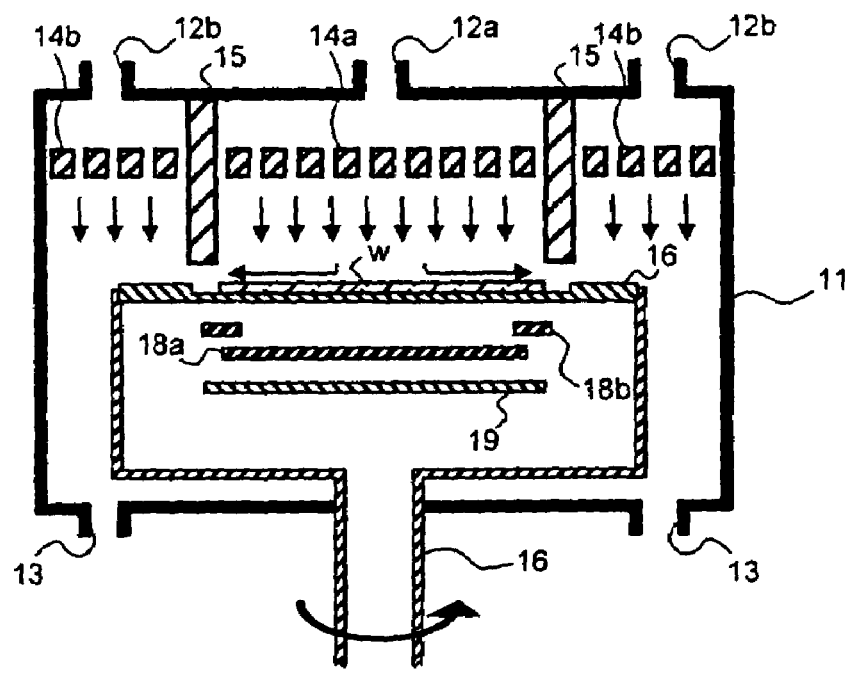
FIG. 1 is a sectional view of an apparatus for manufacturing according to an embodiment of the present invention.
Figure 2:
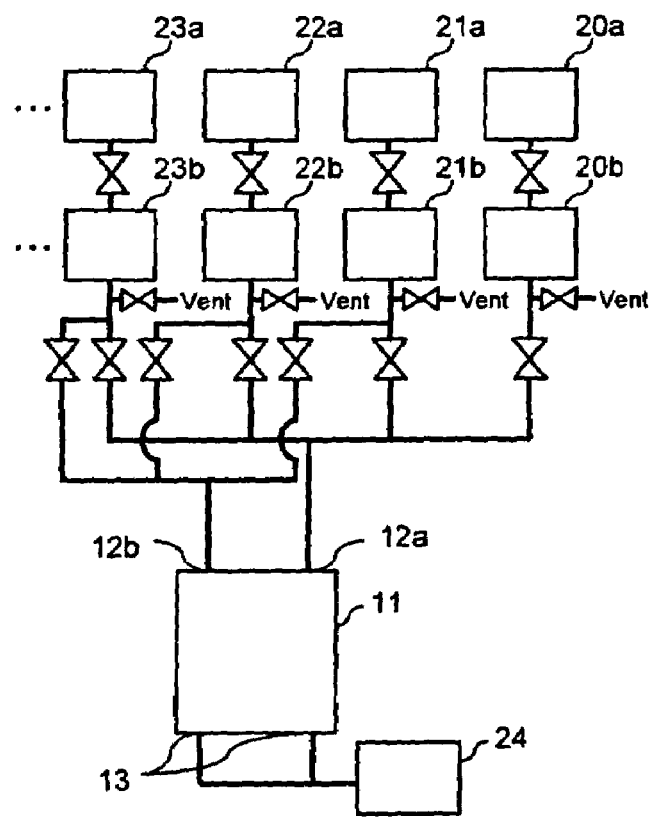
FIG. 2 illustrates configuration of an apparatus for manufacturing according to an embodiment of the present invention.

FIG. 1 is a sectional view of an epitaxial growth apparatus that is a manufacturing apparatus for a semiconductor device according to the present embodiment and FIG. 2 illustrates a configuration thereof. At an upper portion of a reaction chamber 11 where a film is formed on a wafer w, a gas supply mechanism for supplying process gas, cleaning gas and the like controlled to a predetermined supply rate is provided.

The gas supply mechanism includes a gas supply port 12a for supplying gas onto the top of the wafer w and a gas supply port 12b for supplying gas onto the outer periphery of the wafer w.

In the gas supply mechanism, supply sources (20a to 23a . . . ) for respective gases include, for example, a process gas (Cl based source gas) supply source 20a, a carrier gas supply source 21a and a cleaning gas supply source 22b. A flow of the process gas/carrier gas supplied to the gas supply port 12a and the carrier gas/cleaning gas supplied to the gas supply port 12b can be switched to the inside or the outside of the reaction chamber 11 by a solenoid valve connected to each of the mechanisms (20b to 23b . . . ) for controlling respective gases, and a mixing ratio of the gases can be controlled by the each control mechanism.

At the lower portion of the reaction chamber 11, a gas discharge port 13 for discharging gas from the reaction chamber 11 and for controlling the pressure in the reaction chamber 11 to be constant (atmospheric) is provided. The gas discharge port 13 is connected to a gas discharge mechanism 24 such as a discharge pump.

Rectifying plates 14a, 14b are attached below the gas supply ports 12a, 12b, respectively. The rectifying plate 14a is provided to supply the process gas and the like supplied from the gas supply port 12a onto the wafer w in a rectified state. The rectifying plate 14b is provided to supply the cleaning gas and the like supplied from the gas supply port 12b onto the outer periphery of the wafer w in a rectified state.

Between the rectifying plates 14a, 14b, a partition plate 15 is provided so that the distance from a lower end of the partition plate 15 to the wafer w surface is 20 mm, for example.

In the lower portion of the reaction chamber 11, there are provided a rotation drive mechanism 16 for rotating the wafer w including a motor (not illustrated) and a rotating shaft (not illustrated) and a susceptor 17 for retaining the wafer w on the rotation drive mechanism 16.

Below the susceptor 17, an in-heater 18a for heating the wafer w is provided. Between the susceptor 17 and the in-heater 18a, an out-heater 18b for heating the peripheral edge of the wafer w is provided. Below the in-heater 18a, there is provided a disc-shaped reflector 19 for efficiently heating the wafer w.

Using such an epitaxial growth apparatus, for example, a Si epitaxial film is formed on the wafer w. First, a wafer w of, for example, φ200 mm is loaded into the reaction chamber 11 and placed on the susceptor 17. The temperatures of the in-heater 18a and the out heater 18b are controlled so that a temperature of the wafer w is 1,100° C., and the wafer w is rotated at 900 rpm or more by the rotation drive mechanism 16.

Figure 3:
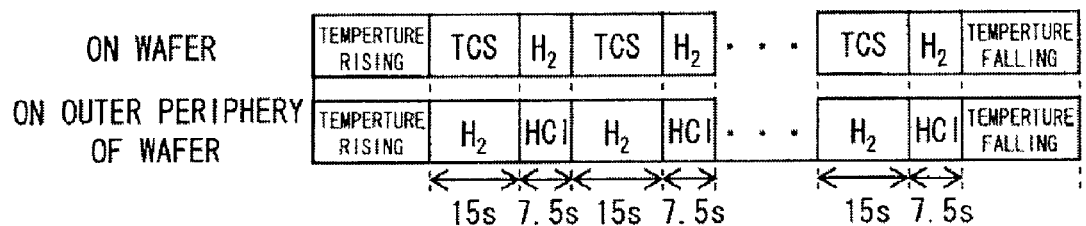
FIG. 3 is a time chart according to an embodiment of the present invention.

As illustrated in a time chart of FIG. 3, first, the process gas conditioned so that a concentration thereof is, for example, 2.5%, using TCS as the Cl based source gas is introduced from the gas supply port 12a at 50 SLM. The process gas is supplied onto the top of the wafer w in a rectified state, for example, for 15 seconds through the rectifying plate 14a to grow a Si epitaxial film on the wafer w.

At the same time, $H_2$ is introduced, for example, at 50 SLW as dilution gas from the gas supply port 12b and supplied onto the outer periphery of the wafer w in a rectified state, for example, for 15 seconds through the rectifying plate 14b to dilute the process gas on the outer periphery of the wafer w. By the partition plate 15, controlling supply rate and concentration, inflow of supplied dilution gas onto the wafer w and mixing with process gas are inhibited.

Next, the supplied gas from the gas supply port 12a is switched to process gas such as $H_2$ excluding source gas. For example, $H_2$ gas is introduced at 50 SLM and is supplied onto the top of the wafer w in a rectified state, for example, for 7.5 seconds through the rectifying plate 14a. By supplying $H_2$ gas, TCS remaining on the wafer w and HCl which is a reaction by-product are discharged from the top of the rotating wafer w and substituted with $H_2$.

At the same time, the supplied gas from the gas supply port 12b is switched to cleaning gas such as $HCl+H_2$ by the gas control mechanism 21c. For example, $HCl+H_2$ gas is introduced at 50 SLM and is supplied onto the outer periphery of the wafer w in a rectified state, for example, for 7.5 seconds through the rectifying plate 14b to remove a polysilicon film deposited on the outer periphery of the wafer w. By the partition plate 15, controlling supply rate and concentration, inflow of supplied cleaning gas onto the wafer w and mixing with process gas are inhibited in the same way as for dilution gas.

Surplus process gas or cleaning gas is discharged from the gas discharge port 13 so that the pressure in the reaction chamber 11 is controlled to be constant (atmospheric). While switching of the flow of the supplied gas onto the top of the wafer w and the outer periphery of the wafer w by the gas control mechanism is being repeated, the Si epitaxial film is grown on the top of the wafer w until a desired film thickness (e.g. 150 μm) is obtained.

By supplying gas onto the wafer w while gas including Cl based source gas and process gas excluding source gas are being switched in this way, the epitaxial growth rate can be increased. In Si epitaxial growth, TCS and dichlorosilane are preferably used as Cl based source gas.

Figure 4:
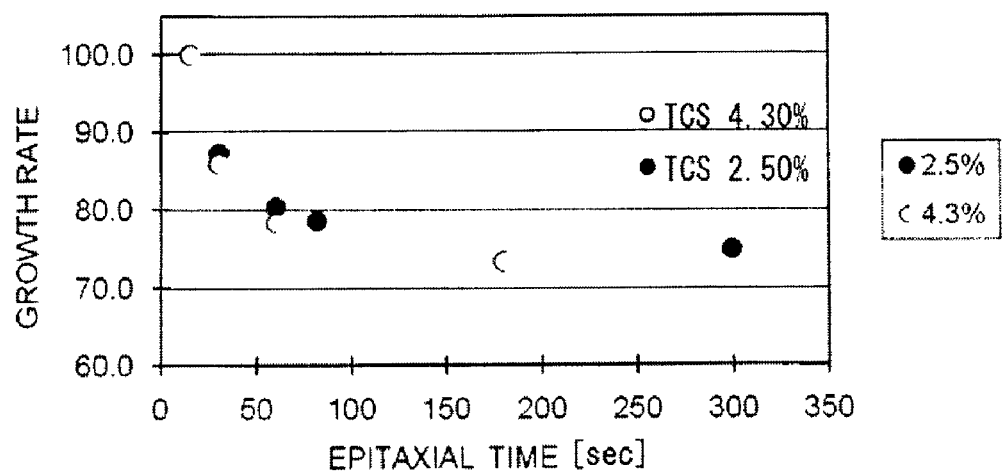
FIG. 4 is a view illustrating one example of a change with time of an epitaxial growth rate according to an embodiment of the present invention.

In the epitaxial growth using Cl based source gas, the epitaxial growth rate decreases with time. FIG. 4 illustrates one example of a change with time of epitaxial growth velocity rate when TCS concentrations are 2.50% and 4.30% and film formation rate for 15 seconds after film formation starts under predetermined conditions is 100. As illustrated in FIG. 4, the epitaxial growth rate relatively drastically decreases until 30 seconds after film formation starts and decreases until 60 seconds. Then, the epitaxial growth rate gradually decreases.

The following may be suggested as a reason. For example, where TCS is used, when TCS and $H_2$ are supplied, the following relational expression is obtained:

$$SiHCl_3 + H_2 \rightarrow Si + 3HCl \qquad (1)$$

As a reaction of (1) proceeds to the right, a Si epitaxial film is formed, but HCl is generated along with Si. This reaction is an equilibrium reaction including a plurality of reactions and, when HCl accumulates on the wafer w and a HCl molar ratio on the wafer w increases, equilibrium is shifted to the left. Accordingly, the proceeding of Si formation reaction is inhibited and the epitaxial growth rate decreases.

Accordingly, supply of TCS is stopped once and HCl accumulated on the wafer w is substituted with $H_2$ or inert gas. TCS is supplied again in a state where HCl on the wafer w is substituted with $H_2$ or inert gas and the equilibrium reaction of Expression (1) will proceeds to the right.

At this time, the process gas to be switched is not limited to $H_2$. The inert gas having no influence on a film formation reaction may be used. In that case, use of heavy gas such as Ar enables highly effective substitution of the process gas.

The switching cycle is, for example, 15 sec./7.5 sec., but may be set suitably. For example, if the initial change of the epitaxial growth rate is drastic, the process gas may be changed to $H_2$ in a shorter time. Further, gas supply time may be set suitably, depending upon the supply rate or concentration of each gas to be supplied.

The gas supplied on the wafer w is switched, and the gas supplied to the outer periphery of the wafer w is switched between $H_2$ which is dilution gas and HCl which is cleaning gas are being switched. Concurrently with film formation, deposition of polysilicon on the outer periphery of the wafer w can be inhibited and deposits of polysilicon and the like on the outer periphery of the wafer w can be removed by cleaning gas.

Dilution gas is not limited to $H_2$ and the inert gas having no influence on a film formation reaction may be used In that case, use of heavy gas such as Ar enables highly effective dilution and removal of the process gas on the outer periphery of the wafer w. The gas supplied onto the outer periphery of the wafer w is not limited to dilution gas such as $H_2$ and Ar, and inclusion of film formation reaction inhibiting gas such as HCl capable of shifting equilibrium of a film formation reaction to inhibit film formation is effective.

Switching between dilution gas and cleaning gas is not always required. Only dilution gas, film formation reaction inhibiting gas or cleaning gas may be supplied. In supplying only cleaning gas, the supply rate and concentration of cleaning gas supplied onto the wafer w is required to be strictly controlled to inhibit mixing of process gas including source gas with cleaning gas. This is the reason why inflow of cleaning gas onto the wafer w may deteriorate uniformity of a film thickness.

Thus, concurrently with the film formation, inhibition and/or removal of deposits on the outer periphery of the wafer w enables to suppress an adverse effect of members and wafer quality by the deposits. Accordingly, the frequency of cleaning the inside of the reaction chamber 11 is reduced, thereby preventing degradation of productivity due to cleaning.

In the present embodiment, the rectifying plates 14a, 14b are provided to supply different gases. The rectifying plate 14a rectifies gas, thus the gas can be supplied onto the wafer w uniformly. Hence, uniformity of a film thickness of an epitaxial film formed on the wafer w can be achieved. Moreover, source gas on the outer periphery of the wafer w can be effectively removed, and mixing with gas supplied onto the wafer w can be effectively inhibited by supplying rectified gas on the outer periphery of the wafer w with the rectifying plate 14b.

Between the rectifying plates 14a, 14b, a partition plate 15 is provided so that the distance from a lower end of the partition plate 15 to the wafer w surface is 20 mm and the lower end of the partition plate 15 is below the rectifying plates 14a, 14b. Although a mixing state of the process gas supplied onto the top of the wafer w with the gas supplied onto the outer periphery of the wafer w is mainly controlled by the supply rate and concentration of the gas supplied onto the outer periphery of the wafer w, the partition plate 15 can effectively inhibit the gas mixing.

From the viewpoint of suppression of the gas mixing, the partition plate 15 is preferably provided as adjacent to the wafer w as possible. However, the gas supplied onto the rotating wafer w generates a boundary layer on the wafer w and excessive gas is discharged in an outer-periphery direction, and therefore the partition plate is required to be provided so as not to be a block in the gas discharge path. For example, in desired process conditions, it is sufficient to measure a deposit volume on the partition plate 15 when an installation height of the partition plate 15 is changed and to install the partition plate 15 at such a height as to minimize the generation deposit volume.

According to the present embodiment, a film such as an epitaxial film can be formed on a semiconductor wafer with high productivity. In addition, the yields of wafers and semiconductor devices manufactured through an element formation process and an element separation process can be improved and stable element characteristics of the semiconductor devices can be obtained. In particular, by applying to an epitaxial formation process of power semiconductor devices such as power MOSFET and IGBT, which require growth of a thick film having a thickness of 100 μm or more in an N-type base region, P-type base region or an insulation isolation region, satisfactory element characteristics can be obtained.

In the embodiment, a case in which a Si single-crystal layer (epitaxial film) is formed is described, the present embodiment may be applied to a case of polysilicon layer formation. In addition, the present embodiment is also applicable to formation of films except Si films such as $SiO_2$ film and $Si_3N_4$ film and manufacture of compound semiconductors such as GaAs layer, GaAlAs and InGaAs, when film growth rate lowers with time.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A manufacturing method for a semiconductor device, comprising:
   retaining a wafer in a reaction chamber;
   supplying a first process gas including source gas and a second process gas containing at least one of $H_2$ and inert gas excluding source gas and cleaning gas onto the wafer in a rectified state perpendicular to the wafer surface, switching back and forth between the first process gas and the second process gas in a predetermined period, and supplying cleaning gas onto an outer periphery of the wafer concurrently with the supply of the first process gas or the second process gas;
   rotating the wafer; and
   heating the wafer to form a film on the wafer.

2. The method according to claim 1, wherein the first process gas and reaction by-product to be generated are substituted with the second process gas.

3. The method according to claim 1, wherein the first process gas includes Cl based source gas.

4. The method according to claim 3, wherein the Cl based source gas includes trichlorosilane or dichlorosilane.

5. The method according to claim 1, wherein at least any of dilution gas and film formation reaction inhibiting gas is supplied onto an outer periphery of the wafer concurrently with supply of the first process gas or the second process gas.

6. The method according to claim 5, wherein the cleaning gas is HCl.

7. The method according to claim 5, wherein the dilution gas includes $H_2$ or Ar.

8. The method according to claim 5, wherein the film formation reaction inhibiting gas includes HCl.

9. The method according to claim 1, wherein the inside of the reaction chamber is controlled to an atmospheric pressure.

10. The method according to claim 1, wherein the wafer is rotated at 900 rpm or more.

11. A manufacturing apparatus for a semiconductor device for forming a film on a wafer, comprising:
    a reaction chamber to load the wafer;
    a first gas supply mechanism configured to supply a first process gas including source gas and a second process gas containing at least one of $H_2$ and inert gas excluding source gas and cleaning gas in the reaction chamber;

a first gas control mechanism configured to control switching back and forth between the first process gas and the second process gas to be alternately supplied;

a first rectifying plate to supply the first process gas or the second process gas supplied from the first gas supply mechanism onto the wafer in a rectified state perpendicular to the wafer surface;

a gas discharge mechanism to discharge the gas from the reaction chamber;

a retention mechanism to retain the wafer at a predetermined position in the reaction chamber; and a heater to heat the wafer.

12. The apparatus according to claim 11, wherein the first process gas includes Cl based source gas.

13. The apparatus according to claim 12, wherein the Cl based source gas includes trichlorosilane or dichlorosilane.

14. The apparatus according to claim 11, wherein the second process gas contains $H_2$ or inert gas.

15. The apparatus according to claim 11, further comprising:

a second gas supply mechanism configured to supply at least any of cleaning gas, dilution gas and film formation reaction inhibiting gas to the reaction chamber and a second rectifying plate to supply any of the cleaning gas, the dilution gas and the film formation reaction inhibiting gas supplied from the second gas supply mechanism onto the outer periphery of the wafer in a rectified state perpendicular to the wafer surface.

16. The apparatus according to claim 15, wherein the cleaning gas is HCl.

17. The apparatus according to claim 15, wherein the dilution gas includes $H_2$ or Ar.

18. The apparatus according to claim 15, wherein the film formation reaction inhibiting gas includes HCl.

19. The apparatus according to claim 15, further comprising a second gas control mechanism configured to control a type of the gas supplied by the second gas supply mechanism to be switched.

20. The apparatus according to claim 15, further comprising a partition plate disposed between the first rectifying plate and the second rectifying plate, the partition plate to be spaced from the wafer, and the partition plate to separate a region above the wafer from a region above the outer periphery of the wafer.

* * * * *